United States Patent [19]

McIlroy et al.

[11] Patent Number: 4,701,774

[45] Date of Patent: Oct. 20, 1987

[54] LIGHT EMITTING SEMICONDUCTOR DEVICE

[75] Inventors: Paul W. A. McIlroy, Tokyo; Atsushi Kurobe, Kawasaki; Hideto Furuyama, Tokyo, all of Japan

[73] Assignee: Kabushiki Kaisha Toshiba, Kawasaki, Japan

[21] Appl. No.: 810,093

[22] Filed: Dec. 18, 1985

[30] Foreign Application Priority Data

Oct. 15, 1985 [JP] Japan .................. 60-229466

[51] Int. Cl.$^4$ .......................................... H01L 33/00
[52] U.S. Cl. ...................................... 357/17; 357/58; 357/16; 357/4
[58] Field of Search .................. 357/63, 17, 16, 90, 357/4 SL, 30 B, 30 E, 30 F, 58; 372/45, 46, 48

[56] References Cited

U.S. PATENT DOCUMENTS

| | | | |
|---|---|---|---|
| 3,982,207 | 9/1976 | Dingle et al. | 357/16 X |
| 4,278,474 | 7/1981 | Blakeslee | 357/30 E |
| 4,439,782 | 3/1984 | Holonyak, Jr. | 357/16 X |
| 4,512,022 | 4/1985 | Tsang | 357/90 X |

FOREIGN PATENT DOCUMENTS

| | | | |
|---|---|---|---|
| 0078177 | 10/1981 | European Pat. Off. | |
| 2099624 | 12/1982 | United Kingdom | 372/45 |

OTHER PUBLICATIONS

Casey, Jr. et al., *Heterostructure Lasers*, Academic Press, N.Y., 1978, pp. 83 and 197.

Yonezu et al., "New Stripe Geometry Laser with High Quality Lasing Characteristics by Horizontal Transverse Mode Stabilization-A Refractive Index Guiding with Zn Doping," Japan J. Appl. Phys., vol. 16, Jan. 1977, No. 1, pp. 209-210.

Fujii et al, "MBE Growth of Extremely High-Quality GaAs-AlGaAs GRIN-SCH Lasers with a Superlattice Buffer Layer", J. Vac. Sci. Technol. B3(2) Mar./Apr. 1985, pp. 776-778.

Yamanishi et al., "Transient Response of Photoluminescence for Electric Field in a GaAs/Al$_{0.7}$Ga$_{0.3}$As Single Quantum Well: Evidence for Field-Induced Increase in Carrier Life Time," *Japanese Journal of Applied Physics*, vol. 24, No. 8, Aug. 1985, pp. L586-L588.

Applied Physics Letters, vol. 44, No. 5, 1st Mar. 1984, pp. 476-478, American Institute of Physics, London, GB; S. D. Hersee et al: Some Characteristics of the GaAs/GaAlAs Graded-Index Separate-Confinement Heterostructure Quantum Well Laser Structure.

Japanese Journal of Applied Physics Supplm. Extended Abstracts of the 16th Int. Conf. Solid State Devices and Materials, Kobe 8/30-9/1, 1984 pp. 145-148, T. Fujii et al; "Extremely High-Quality GaAs-AlGaAs GRIN-SCH Lasers with a Superlattice . . . ".

Applied Physics Letters, vol. 43, No. 10, 15th Nov. 1983, pp. 954-956, American Institute of Physics, New York, U.S.

R. C. Miller et al; "Some Effects of a Longitudinal Electric Field on the Photoluminescence of P-Doped GaAs-Al$_x$Ga$_{1-x}$As . . . ".

*Primary Examiner*—Martin H. Edlow
*Assistant Examiner*—William A. Mintel
*Attorney, Agent, or Firm*—Oblon, Fisher, Spivak, McClelland, & Maier

[57] ABSTRACT

In a carrier injection type light emitting semiconductor device with a QW structure, a p-type impurity doped layer and/or an n-type impurity doped layer are inserted into an optical wave guide layer so as to cancel an internal electric field in an active region.

12 Claims, 14 Drawing Figures

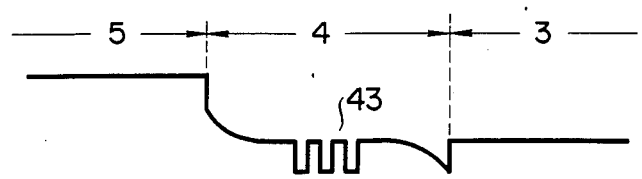
FIG. 3
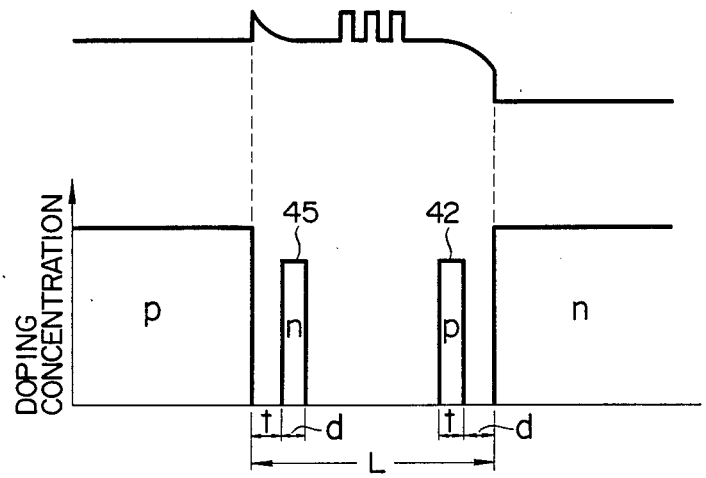
FIG. 4
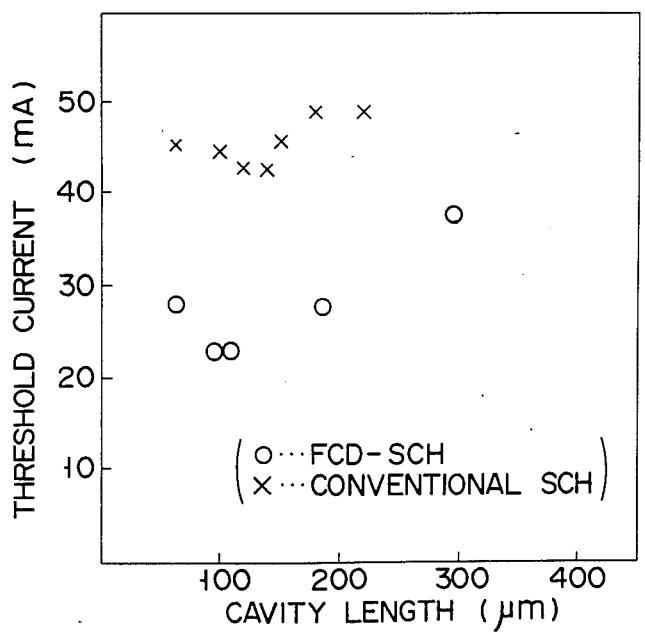

LIGHT EMITTING SEMICONDUCTOR DEVICE

BACKGROUND OF THE INVENTION

The present invention relates to a carrier injection type light emitting semiconductor device utilizing a quantum effect.

A light emitting semiconductor laser with one or more quantum wells in its active region is referred to as a QW laser. A QW is formed by a semiconductor layer having a band-gap narrower than the surrounding material and a thickness smaller than the de Broglie wavelength. An injection type QW laser has a QW active region formed within the optical guide region of a semiconductor laser having a double-hetero (DH) structure. In such a QW laser, electronic motion is quantized perpendicular to the semiconductor layer. For this reason, the wave function is localized perpendicular to the semiconductor layer, and a two-dimensional electron gas (2 DEG), having freedom of movement only in a direction parallel to the semiconductor layer, is formed. The density of states of this 2 DEG rises abruptly from zero at the band edge. Therefore, the QW laser has a higher light emission efficiency than normal DH lasers. Other special features of the QW laser include its small threshold current, its capability of high-speed modulation, and the variability of its oscillation frequency. Because of these features, the QW laser is used in both optoelectronic IC (OEICs) and high-speed modulation optical device applications.

Nevertheless, in a conventional QW laser, an internal electric field exists in the active region under zero bias conditions, and this prevents any further improvement in QW laser characteristics.

FIG. 13 shows the energy band diagram and doping concentration profile of a conventional QW laser with an SCH (Separate Confinement Hetero) structure, i.e. a structure in which the carrier and optical confinement regions are distinct from each other. Reference numeral 11 denotes a p-type cladding layer; 12, an intrinsic optical wave guide layer; and 13, an n-type cladding layer. The p-type cladding layer 11 injects holes into the optical wave guide layer 12, and the n-type cladding layer 13 injects electrons into layer 12. Layer 12 has a semiconductor band gap narrower than those of layers 11 and 13, and makes optical confinement possible. Active region 14 is formed inside layer 12. Active region 14 commonly has a multi-quantum well (MQW) structure, in which a plurality of narrower band gap semiconductor layers (QW layers) are stacked so that a wider band gap semiconductor layer (barrier layer) is sandwiched between each two QW layers. For the sake of simplicity, FIG. 13 shows an energy band diagram with only one QW layer. This diagram corresponds to the zero bias state of the diode. As can be seen from FIG. 13, in this QW laser, there is an internal electric field in region 12 resulting from the difference in electron affinities of layers 11 and 13.

FIG. 14 shows the energy band diagram when a forward bias voltage Vb is applied to the above QW laser. When a forward bias voltage is applied, electrons and holes are injected into region 14 from layers 13 and 11, respectively. FIG. 14 shows a state wherein the bias voltage Vb is smaller than the diffusion potential Vbi. In practice, the QW laser begins to oscillate in this state, i.e., in a state in which there exists an internal electric field of about 10 kV/cm in active region 14. This causes the oscillation threshold current of the QW laser to be higher than it need be. The reason for this is as follows.

Firstly, when an internal electric field exists in active region 14, the quantized electron wave function 15 and the quantized hole wave function 16 are displaced towards opposite edges of the QW. This causes a quenching of the optical transition matrix element. For the MQW structure, this quenching effect is large unless the resonant energy between the QW layers is very large.

Secondly, when an internal electric field exists in the active region, the potential of a barrier layer between two QW layers is decreased. For this reason, carriers injected into a QW layer can easily escape therefrom by tunneling, thereby degrading the desired carrier confinement. This is known as Fowler-Nordheim tunneling. Carriers escaping from the QW layer cause non-radiative recombination. As a result, the quantum efficiency of the QW laser is degraded.

For the above reasons, a conventional QW laser has a larger oscillation threshold current and a smaller quantum efficiency than is its inherent capability.

SUMMARY OF THE INVENTION

It is the object of the present invention to reduce the threshold current of an injection type light emitting semiconductor device with a QW structure, and to achieve a high quantum efficiency.

The light emitting semiconductor device intended by the present invention is an injection type device with a QW structure, having one or more impurity doped layers for suppressing the internal electric field within its active region. More specifically, a light emitting semiconductor device of the present invention comprises a first semiconductor region in which an active region having one or more QWs is formed; an n-type second semiconductor region, formed adjacent to one side of the first semiconductor region, for injecting electrons into the active region; and a p-type third semiconductor region, formed adjacent to the other side of the first semiconductor region, for injecting holes into the active region. In addition, the device comprises one or more impurity doped layers for suppressing an internal electric field. The doped layers for suppressing the internal electric field are one or more p-type impurity doped layers formed between the active region (within the first semiconductor region) and the second semiconductor region, and/or one or more n-type impurity doped layers formed between the active region and the third semiconductor region.

BRIEF DESCRIPTION OF THE DRAWINGS

FIG. 3 is a view showing the energy band diagram and doping concentration distribution of the main part of FIG. 1;

FIG. 4 is a graph showing the SCH-QW laser characteristics of this embodiment, and for comparison those of a conventional SCH-QW laser;

DETAILED DESCRIPTION OF THE PREFERRED EMBODIMENTS

Figure 1:
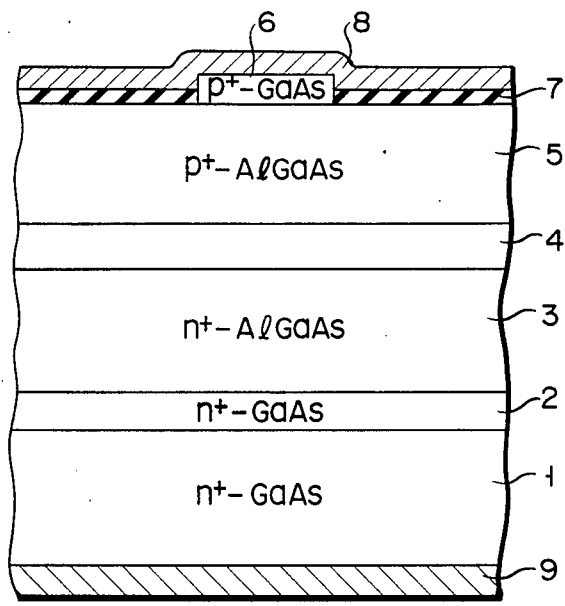
FIG. 1 is a sectional view of an SCH-QW laser embodying the present invention.

In the SCH-QW laser shown in FIG. 1, an $n^+$-type GaAs buffer layer 2, an $n^+$-type $Al_XGa_{1-X}As$ cladding layer 3, an optical wave guide layer 4, a $p^+$-type $Al_XGa_{1-X}As$ cladding layer 5, and a $p^+$-type GaAs stripe-like cap layer 6 are sequentially stacked on top of $n^+$-type GaAs substrate 1. In this embodiment, optical wave guide layer 4 corresponds to the first semiconductor region in which an active layer (to be described later) is formed; cladding layer 3 corresponds to the second semiconductor region for injecting electrons into the active layer; and cladding layer 5 corresponds to the third semiconductor region for injecting holes into the active region. Insulating film 7, which is a native oxide film, is formed on top of cladding layer 5. P-side electrode 8, contacting cap layer 6 through a stripe-like opening formed in insulating film 7, is formed thereon. N-side electrode 9 is formed on the back surface of substrate 1. This structure is called an NOS (Native Oxide Stripe) structure.

Figure 2:
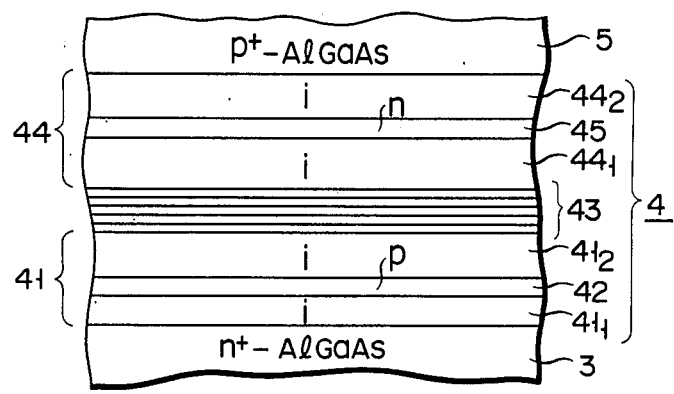
FIG. 2 is an enlarged sectional view of the main part of FIG. 1.

FIG. 2 shows an enlargement of the main portion of this SCH-QW laser. As shown in FIG. 2, optical wave guide layer 4 comprises lower optical wave guide layer 41, active region 43, and upper optical wave guide layer 44, which are stacked on top of each other. Lower optical wave guide layer 41 comprises an undoped (intrinsic) $Al_YGa_{1-Y}As$ layer $41_1$, a p-type $Al_YGa_{1-Y}As$ layer 42 and an intrinsic $Al_YGa_{1-Y}As$ layer $41_2$, which are stacked on each other. Upper optical wave guide layer 44 comprises an intrinsic $Al_YGa_{1-Y}As$ layer $44_1$, an n-type $Al_YGa_{1-Y}As$ layer 45, and an intrinsic $Al_YGa_{1-Y}As$ layer $44_2$, which are stacked on top of each other. Layers 42 and 45 are impurity doped layers formed so as to suppress the internal electric field in active region 43. Composition ratios X and Y are selected so as to make the band gap of layers 41 and 44 narrower than that of layers 3 and 5. Thus, heterojunctions are formed between layer 4 and layers 3 and 5. Active region 43 has an MQW structure. In region 43, a plurality of intrinsic GaAs layers which are active (QW) layers are sandwiched between $Al_ZGa_{1-Z}As$ barrier layers having a wider band gap than that of the QW layers.

The composition, doping concentration, and thickness of each semiconductor layer are as follows. The composition ratios of the AlGaAs layers are $X=0.5$, and $Y=Z=0.28$. Substrate 1 has a doping concentration of $2\times10^{18}/cm^3$ and a thickness of 90 μm. Buffer layer 2 has a doping concentration of $5\times10^{18}/cm^3$ and a thickness of 0.5 μm. Cladding layers 3 and 5 have a doping concentration of $2\times10^{18}/cm^3$ and a thickness of 2 μm. Cap layer 6 has a doping concentration of $5\times10^{18}/cm^3$ and a thickness of 0.5 μm. The thickness of layers $41_1$ and $44_2$ of layer 4 is 100 Å. The thickness of layers $41_2$ and $44_1$ is 595 Å. Layers 42 and 45 have a doping concentration of $1\times10^{18}/cm^3$ and a thickness of 100 Å. In region 43, 70-Å thick GaAs layers and 50-Å thick $Al_ZGa_{1-Z}As$ layers are stacked alternately on top of each other.

The above semiconductor layers are grown by molecular beam epitaxy (MBE) or by metal-organic chemical vapor deposition (MOCVD). With these methods, the above composition, doping concentration, and the thickness of each semiconductor layer can easily be controlled.

FIG. 3 shows the energy band diagram and doping concentration distribution of the SCH-QW laser depicted in FIG. 2. P-type layer 42 and n-type layer 45 are incorporated between active region 43 and cladding layers 3 and 5 respectively, and these impurity doped layers act as charge sheets. With the structure shown in FIG. 3, the internal electric field in region 43 is cancelled or reduced. Therefore, in the QW laser corresponding to this embodiment, the oscillation threshold current is lower than that of a conventional structure.

The present inventors call the QW laser structure of this embodiment an FCD (Field Cancelling Dipole) structure, meaning by this a structure in which the internal electric field is moderated by a dipole charge distribution. When an FCD structure is adopted, the internal electric field is suppressed to the following extent. Referring to FIG. 3, assuming that the thickness L of layer 4 is 1,500 Å, the thickness d of p- and n-type layers 42 and 45 is 100 Å, and the distance t between layer 42 (or 45) and cladding layer 3 (or 5) is 100 Å, assuming that the doping concentration of layers 3 and 5 is $2\times10^{18}/cm^3$, and assuming that a forward bias Vb, smaller than the diffusion potential Vbi, is applied to the QW laser, such that $Vbi-Vb=0.27$ [eV], then, under these conditions, if layers 42 and 45 are omitted, the internal electric field existing in region 43 is approximately 17 to 18 kV/cm. However, when the electric field cancelling effect of layers 42 and 45 of doping concentration $5\times10^{17}/cm^3$ is included, the internal electric field is decreased to one tenth or less of its intensity without cancelling.

FIG. 4 shows the results of measurements of the oscillation threshold currents of a number of SCH-QW laser devices with and without the FCD structure. The abscissa indicates the cavity length. As described above, the SCH-QW laser of this embodiment includes layers 42 and 45 of doping concentration $1\times10^{18}/cm^3$ for moderating the internal electric field. For comparison, the conventional SCH-QW laser devices, i.e. those without the FCD structure, were produced under the same conditions as the laser devices of this embodiment, excepting that the impurity doped layers for cancelling the electric field were omitted. The width W of the contact stripe in the natural oxide film is 5 μm.

As can be seen from FIG. 4, in the SCH-QW laser of this embodiment, the threshold current is reduced by 50% relative to that of the conventional laser. Furthermore, for the device of this embodiment, in addition to the reduction in threshold current, the SCH-QW laser quantum efficiency is high.

The doping concentration and the thickness of the semiconductor layers in the above embodiment can be changed if so wished. For example, the optical wave guide layer need not be an undoped layer, but can be an n- or p-type layer. The doping concentration of layers 42 and 45, respectively, need not be equal. If, for example, the doping concentration of layer 45 is made lower than that of layer 42, the hole injection efficiency into region 43 from layer 5 can be improved. Conversely, if the doping concentration of layer 42 is made lower than that of layer 45, the electron injection efficiency into region 43 from layer 3 can be improved.

Figure 5:
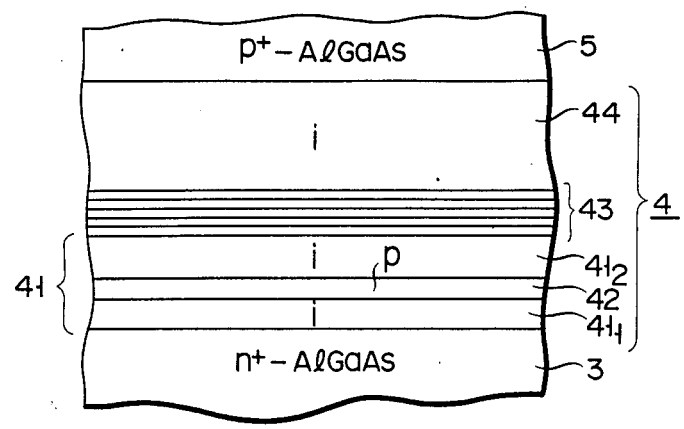
FIG. 5 is a sectional view showing the main part of another SCH-QW laser embodying the present invention.

FIG. 5 shows a sectional view of the structure of the main part of an SCH-QW laser corresponding to another embodiment of the type shown in FIG. 2. In this QW laser, an n-type impurity doped layer is not formed between active region 43 and p+-type cladding layer 5. In every other respect, however, this QW laser is the same as the QW laser of the previous embodiment.

Figure 6:
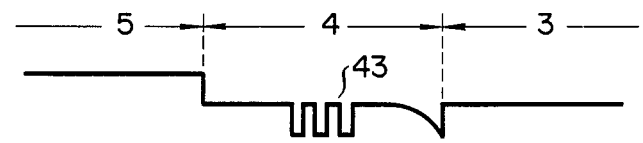
FIG. 6 is a view showing the energy band diagram and doping concentration distribution of the device of FIG. 5.
Figure 6:
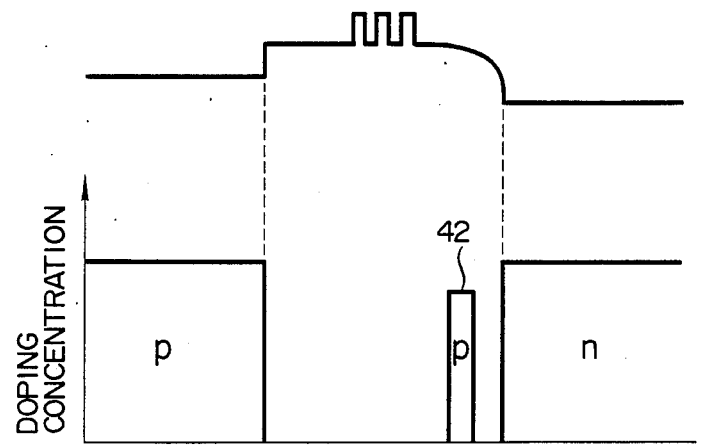

FIG. 6 shows the energy band diagram and doping concentration distribution of the main part of the QW laser of this embodiment. As can be seen from FIG. 6, the internal electric field in active region 43 can also be cancelled in the structure of this embodiment. Therefore, the threshold current can be reduced and the quantum efficiency can be improved as effectively as in the device of the previous embodiment.

Figure 7:
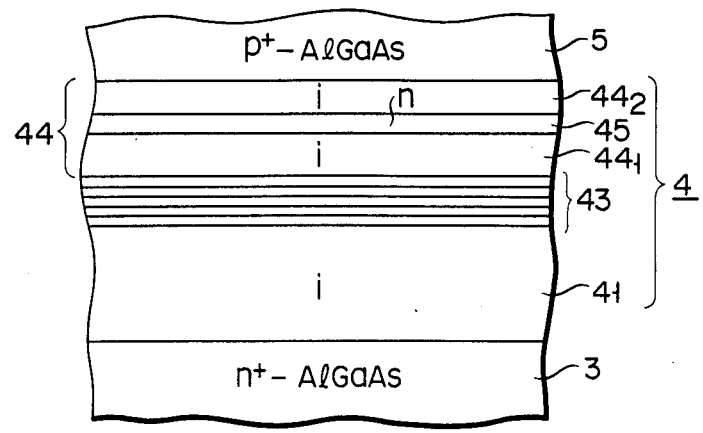
FIG. 7 is a sectional view showing the main part of still another SCH-QW laser embodying the present invention.

FIG. 7 shows a sectional view of the structure of the main part of a QW laser corresponding to still another embodiment of the type shown in FIG. 2. In this QW laser, a p-type impurity doped layer is not formed between active region 43 and n+-type cladding layer 3. In every other respect, however, this QW laser is the same as the QW laser of the embodiment shown in FIG. 1.

Figure 8:
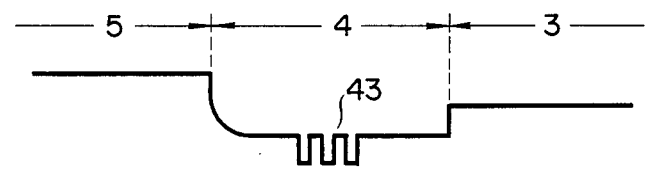
FIG. 8 is a view showing the energy band diagram and doping concentration distribution of the device of FIG. 7.
Figure 8:
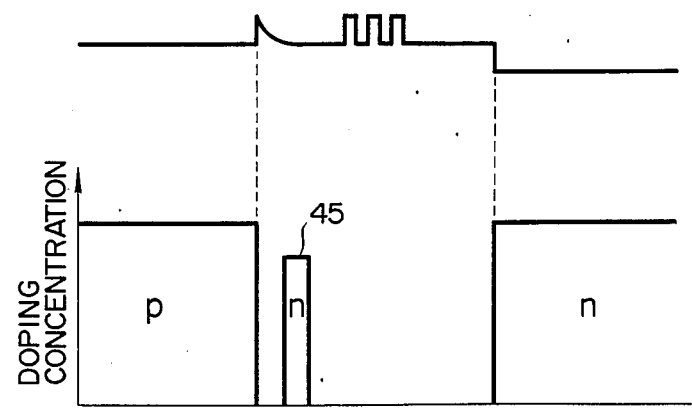

FIG. 8 shows the energy band diagram and doping concentration distribution of the main part of the QW laser of this embodiment. With the structure of this embodiment also, the internal electric field in the active region 43 can be cancelled.

Figure 9:
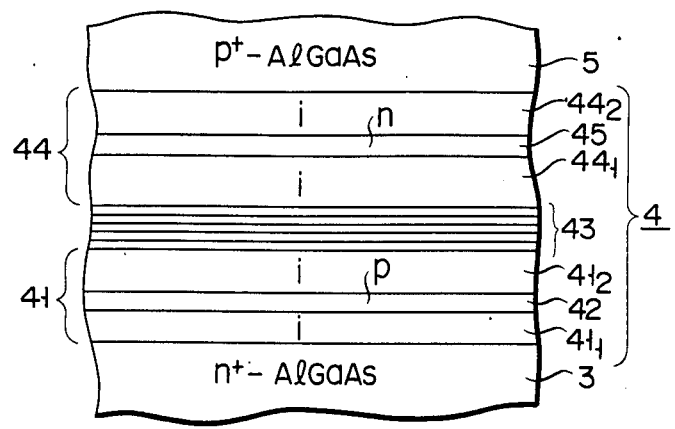
FIG. 9 is a sectional view showing the main part of a GRIN-SCH-QW laser which is still another embodiment of the present invention.

FIG. 9 shows the main part of a QW laser corresponding to still another embodiment, of the type shown in FIG. 2. The basic structure of this embodiment is the same as that of the embodiment shown in FIG. 1. However, in this embodiment, the upper and lower optical wave guide layers 41 and 44 have a structure wherein the composition of the $Al_yGa_{1-y}As$ forming these layers varies so that the band gap gradually increases with increasing distance from region 43. This basic structure is known as a GRIN-SCH (Graded Refractive INdex Separate Confinement Hetero) structure.

Figure 10:
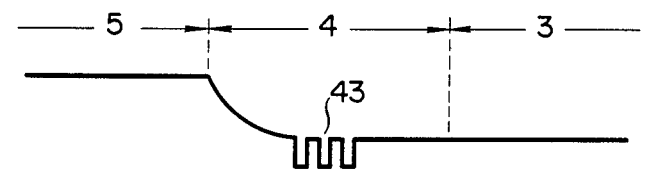
FIG. 10 is a view showing the energy band diagram and doping concentration distribution of the device of FIG. 9.
Figure 10:
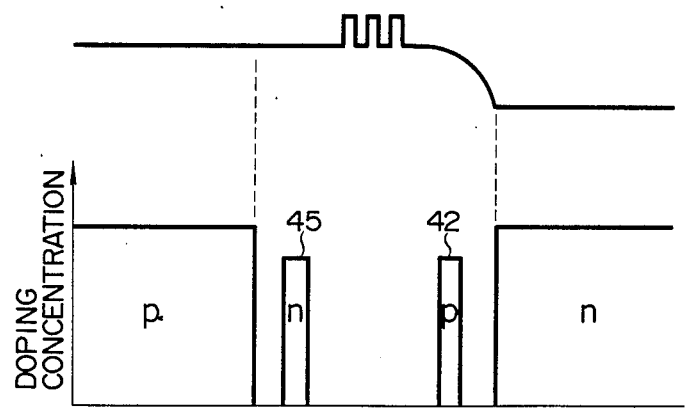

FIG. 10 is the energy band diagram of the main part of this QW laser. As can be seen from FIG. 10, in this QW laser, a step junction is not formed between cladding layers 3 and 5, and optical wave guide layer 4.

In a QW laser with a GRIN-SCH structure, there exists an effective electric field which drives carriers injected from the cladding layers into the optical wave guide layer towards the active region. Because of this, the efficiency of injection of carriers into the active region is higher than for conventional SCH-QW lasers. In a QW laser with a conventional GRIN-SCH structure, however, there also exists an internal electric field due to the difference in the electron affinities of the cladding layers, and this prevents the attainment of very low oscillation threshold currents. In the embodiment of FIG. 9, however, p- and n-type impurity doped layers are formed within the optical wave guide layer of the QW laser with the GRIN-SCH structure, as per the embodiment shown in FIG. 1, thereby decreasing the oscillation threshold current and increasing the quantum efficiency.

In all the above embodiments, the first semiconductor region is the optical wave guide layer, the second semiconductor region is the n+-type cladding layer for injecting electrons into the active region, and the third semiconductor region is the p+-type cladding layer for injecting holes into the active region. In other words, in the above embodiments, the cladding layers for optical confinement also act as electrode layers for carrier injection. The present invention, however, can also be applied to a QW laser in which the edge of a cladding layer for optical confinement is not coincident with an electrode layer for carrier injection. For example, the impurity doped layer or layers for cancelling the internal electric field can be included within an optical wave guide layer or a cladding layer outside the wave guide layer.

Figure 11:
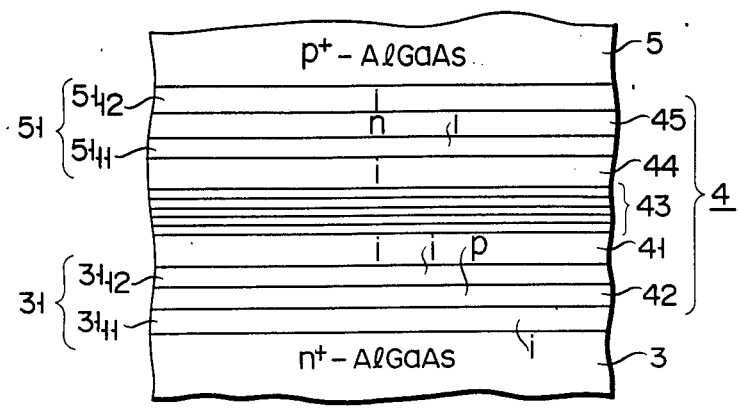
FIG. 11 is a sectional view showing the main part of an SCH-QW laser which is still another embodiment.

FIG. 11 shows the main part of an SCH-QW laser corresponding to another embodiment, along the same lines as that of FIG. 2. The first semiconductor region includes the optical wave guide layer 4, together with the intrinsic $Al_xGa_{1-x}As$ cladding layers 31 and 51 formed on the sides thereof. N+-type $Al_xGa_{1-x}As$ cladding layer 3, which is the second semiconductor region for injecting electrons, is formed outside layer 31. P+-type $Al_xGa_{1-x}As$ cladding layer 5, which is the third semiconductor region for injecting holes, is formed outside layer 51. Active region 43 has the same MQW structure as that of the previous embodiments. Active region 43 is sandwiched between intrinsic $Al_yGa_{1-y}As$ optical wave guide layers 41 and 44. Impurity doped layers for cancelling the internal electric field, p-type $Al_xGa_{1-x}As$ layer 42, and n-type $Al_xGa1-XAs$ layer 45, are inserted in layers 31 and 51 respectively.

Figure 12:
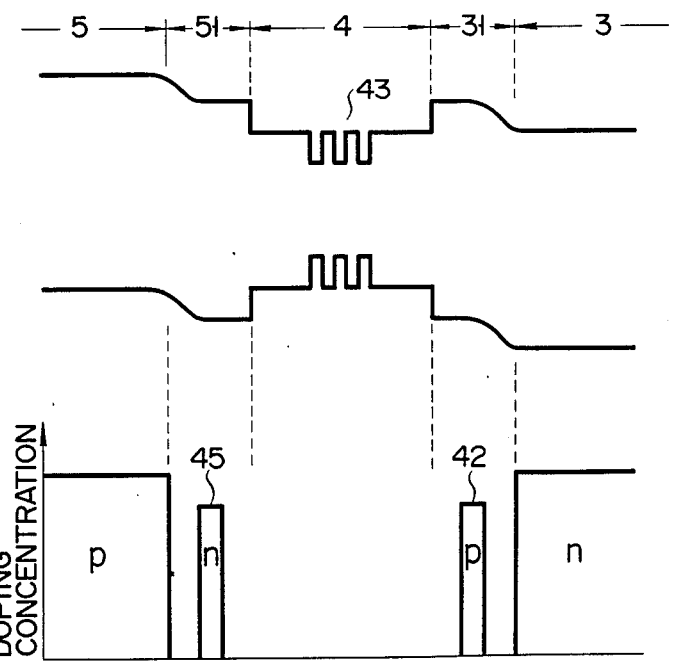
FIG. 12 is a view showing the energy band diagram and doping concentration distribution of the device of FIG. 11.
Figure 13:
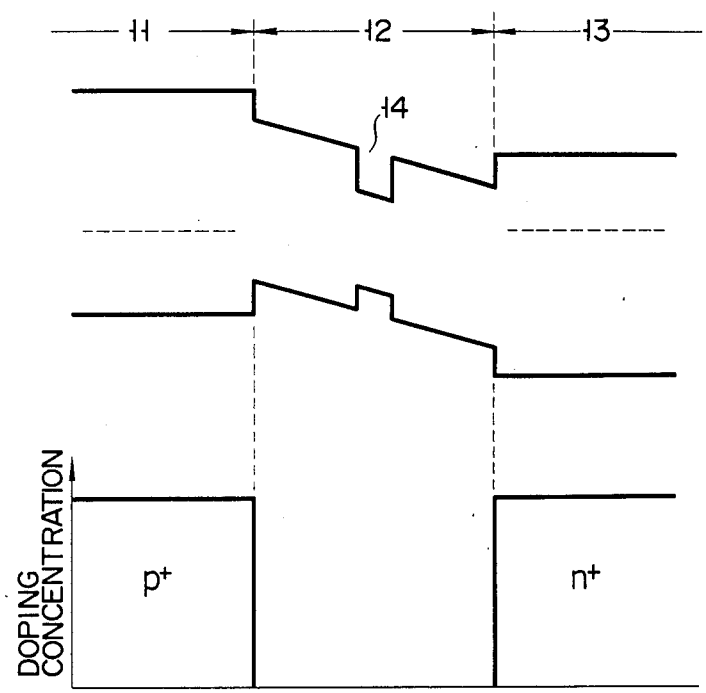
FIG. 13 is a view showing the energy band diagram and doping concentration distribution of the main part of a conventional SCH-QW laser.
Figure 14:
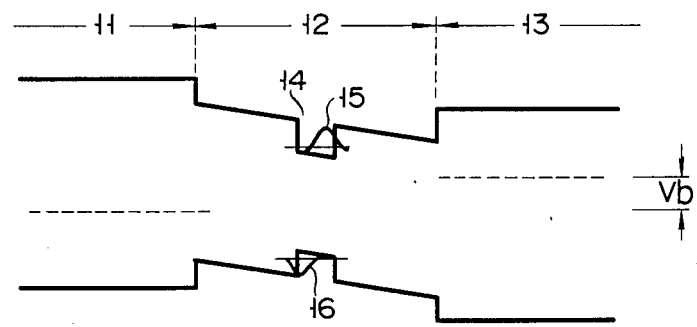
FIG. 14 is the energy band diagram when a forward bias is applied to the QW laser shown in FIG. 13.

FIG. 12 shows the energy band diagram and doping concentration distribution of the main part of the SCH-QW laser of this embodiment. With this embodiment likewise, a reduction in the threshold current of the QW laser and an increase in quantum efficiency can be achieved.

In a device with a structure wherein only one impurity doped layer is provided, such as the embodiment shown in FIGS. 5 or 7, an intrinsic cladding layer can be provided outside the optical wave guide layer, and the impurity doped layer for cancelling the electric field can be inserted therein. This can also be applied to a device with a GRIN-SCH structure. In a QW laser in which the optical and carrier confinement regions coincide, an impurity doped layer for cancelling an electric field can be formed in an intrinsic cladding layer outside the active layer.

The present invention is not limited to the above embodiments. In addition to GaAs/AlGaAS based materials, the present invention is effective when InP/InGaAsP based materials are used. In the above embodiments, the application to laser oscillators has been described. However, the present invention can be applied to LEDs (Light Emitting Diodes) without resonators or to non-oscillating laser amplifiers. In the above embodiments, a so-called MQW structure including a plurality of QW layers has been described. However, the present invention is also effective when the active region has only one QW layer.

What is claimed is:

1. A light emitting semiconductor device comprising:
   a multilayered semiconductor body in which an active region having at least one quantum well is formed;
   an n-type semiconductor layer, disposed adjacent to one side of said multilayered semiconductor body, for injecting electrons into said active region;
   a p-type semiconductor layer, disposed adjacent to the other side of said multilayered semiconductor body, for injecting holes into said active region;
   at least one p-type impurity doped layer formed in said multilayered semiconductor body, disposed between said n-type semiconductor layer and said active region; and
   at least one n-type impurity doped layer formed in said multilayered semiconductor body, disposed between said p-type semiconductor layer and said active region.

2. A device according to claim 1, wherein said multilayered semiconductor body is an optical wave guide in which said active region is formed, said n-type and p-type semiconductor layers are cladding layers having a wider band gap than that of said optical wave guide, and said at least one p-type impurity doped layer and said at least one n-type impurity doped layer is formed in said optical wave guide.

3. A device according to claim 1, wherein said multilayered semiconductor body is an optical wave guide in which the band gap becomes wider with increasing distance from said active region, said n-type and p-type semiconductor layers are cladding layers having a wider band gap than that of said optical wave guide, and said at least one p-type impurity doped layer and said at least one n-type impurity doped layer is formed in said optical wave guide.

4. A device according to claim 1, wherein said multilayered semiconductor body comprises an optical wave guide and portions of cladding layers having a wider band gap than that of said optical wave guide, said optical wave guide having said active region formed therein, said portions of cladding layers sandwiching said optical wave guide therebetween, and wherein said at least one p-type impurity doped layer and said at least one n-type impurity doped layer is formed in said portions of cladding layers.

5. A light emitting semiconductor device comprising:
   a multilayered semiconductor body in which an active region having one or more quantum wells is formed;
   an n-type semiconductor layer, disposed adjacent to one side of said multilayered semiconductor body, for injecting electrons into said active region;
   a p-type semiconductor layer, disposed adjacent to the other side of said multilayered semiconductor body, for injecting holes into said active region; and
   at least one p-type impurity doped layer formed in said multilayered semiconductor body, disposed between said n-type semiconductor layer and said active region.

6. A device according to claim 5, wherein said multilayered semiconductor body is an optical wave guide in which said active region is formed, said n-type and p-type semiconductor layers are cladding layers having a wider band gap than that of said optical wave guide, and said at least one p-type impurity doped layer is formed in said optical wave guide.

7. A device according to claim 5, wherein said multilayered semiconductor body is an optical wave guide in which the band gap becomes wider with increasing distance from said active region, said n-type and p-type semiconductor layers are cladding layers having a wider band gap than that of said optical wave guide, and said at least one p-type impurity doped layer is formed in said optical wave guide.

8. A device according to claim 5, wherein said multilayered semiconductor body comprises an optical wave guide and portions of cladding layers having a wider band gap than that of said optical wave guide, said optical wave guide having said active region formed therein, said portions of cladding layers sandwiching said optical wave guide therebetween, and wherein said at least one p-type impurity doped layer is formed in said portions of cladding layers.

9. A light emitting semiconductor device comprising:
   a multilayered semiconductor body in which an active region having one or more quantum wells is formed;
   an n-type semiconductor layer, disposed adjacent to one side of said multilayered semiconductor body, for injecting electrons into said active region;
   a p-type semiconductor layer, disposed adjacent to the other side of said multilayered semiconductor body, for injecting holes into said active region; and
   at least one n-type impurity doped layer formed in said multilayered semiconductor body, disposed between said p-type semiconductor layer and said active region.

10. A device according to claim 9, wherein said multilayered semiconductor body is an optical wave guide in which said active region is formed, said n-type and p-type semiconductor layers are cladding layers having a wider band gap than that of said optical wave guide, and said at least one n-type impurity doped layer is formed in said optical wave guide.

11. A device according to claim 5, wherein said multilayered semiconductor body is an optical wave guide in which the band gap becomes wider with increasing distance from said active region, said n-type and p-type semiconductor layers are cladding layers having a wider band gap than that of said optical wave guide, and said at least one n-type impurity doped layer is formed in said optical wave guide.

12. A device according to claim 5, wherein said multilayered semiconductor body comprises an optical wave guide and portions of cladding layers having a wider band gap than that of said optical wave guide, said optical wave guide having said active region formed therein, said portions of cladding layers sandwiching said optical wave guide therebetween, and wherein said at least one n-type impurity doped layer is formed in said portions of cladding layers.

* * * * *